United States Patent [19]

Ohta et al.

[11] Patent Number: 4,902,648

[45] Date of Patent: Feb. 20, 1990

[54] PROCESS FOR PRODUCING A THERMOELECTRIC MODULE

[75] Inventors: Toshitaka Ohta; Takenobu Kajikawa, both of Tsukuba, Japan

[73] Assignee: Agency of Industrial Science and Technology, Tokyo, Japan

[21] Appl. No.: 292,888

[22] Filed: Jan. 3, 1989

[30] Foreign Application Priority Data

Jan. 5, 1988 [JP] Japan .................................. 63-573
Jan. 5, 1988 [JP] Japan .................................. 63-574

[51] Int. Cl.⁴ ........................................... H01L 35/28
[52] U.S. Cl. .................................. 437/247; 437/903; 357/28; 357/87; 136/200; 136/237; 136/201
[58] Field of Search ................. 437/903, 51, 205, 247, 437/202, 182, 247; 357/28, 87; 136/237, 238, 230, 232, 200, 201, 212

[56] References Cited

U.S. PATENT DOCUMENTS

| | | | |
|---|---|---|---|
| 3,310,493 | 3/1967 | Rupprecht | 136/240 |
| 3,481,795 | 12/1969 | Lane | 136/237 |
| 3,781,176 | 12/1973 | Penn et al. | 437/903 |
| 4,459,428 | 7/1984 | Chou | 437/247 |
| 4,465,895 | 8/1984 | Verner et al. | 136/201 |
| 4,493,939 | 1/1985 | Blaske et al. | 357/81 |
| 4,687,879 | 8/1987 | Hendricks | 136/212 |

FOREIGN PATENT DOCUMENTS 0147287 9/1982 Japan ................................. 136/200

Primary Examiner—Olik Chaudhuri
Assistant Examiner—Tuan Nguyen
Attorney, Agent, or Firm—Spencer & Frank

[57] ABSTRACT

A thermoelectric module comprises a first electrode array having a plurality of electrode pieces and a second electrode array having a plurality of electrode pieces. The first and second electrode arrays are confronted with each other. The electrode pieces of the first electrode array are alternately connected with the electrode pieces of the second electrode array in such a way that one end portion of each electrode piece of the first electrode array is connected with one end portion of an electrode piece of the second electrode array through a thermoelectric element of first conductive type while the other end portion of the each electrode piece of the first electrode array is connected with one end portion of another electrode piece of the second electrode array through a thermoelectric element of second conductive type. The weight per unit output of the thermoelectric module is small.

7 Claims, 4 Drawing Sheets

PROCESS FOR PRODUCING A THERMOELECTRIC MODULE

BACKGROUND OF THE INVENTION

1. Field of the Invention

The present invention relates to thermoelectric modules and processes for producing the same. More particularly, the invention relates to a thermoelectric module using a small amount of material per unit output thereof, and a process for producing thermoelectric modules of the kind as described above in high yield and at low processing cost.

2. Description of the Prior Art

Conventional thermoelectric modules are produced by a process comprising cutting a melt-grown ingot thermoelectric material into bulk thermoelectric elements and bonding electrodes to the thermoelectric elements through soldering or the like technique. According to an alternative process, a chalcogenide alloy powder as thermoelectric elements is vacuum-sealed or sealed with inert gas in an ampule sintered to produce thermoelectric elements. Thermoelectric elements which are formed in these processes have a high figure of merit to provide an advantage of giving good thermoelectric conversion characteristics to thermoelectric modules.

However, the conventional production of thermoelectric modules in which use is made of an ingot thermoelectric material involves the following serious problems:

(1) since the yield of thermoelectric elements notably lowers when the thickness thereof is reduced to 1.5 mm or less, miniaturization of thermoelectric elements is difficult, with the result that the amount of a thermoelectric material used is inevitable large per unit output of a thermoelectric module and the material cost is high;

(2) because of cracking of a thermoelectric material in the cutting step and of high liability to poor electric conduction or short circuit across electrodes which is caused by failure in bonding of electrodes to thermoelectric elements through soldering or the like technique, the yield is notably lowered through the process of production of thermoelectric modules with high liability to formation of defective modules; and (3) since thermoelectric elements not only are produced one by one but also are brittle, the automation of the production process is difficult and hence the processing cost is high.

The process in which use is made of sintering of a chalcogenide alloy powder has a problem of low productivity because pressure molding is necessary and moldings must be sintered in a state of being sealed in a container such as an ampule. And by this process, thermoelectric elements are produced one by on in the same manner as the former process, so that the automation of the production process and the reduction of the processing cost are difficult.

SUMMARY OF THE INVENTION

The present invention has been made with a view to solving the above-mentioned problems of the prior art.

An object of the present invention is to provide a thermoelectric module having a light weight per unit output thereof.

Another object of the present invention is to provide a thermoelectric module having thermoelectric elements improved in mechanical strength, the production of which can be easily automated.

Still another object of the present invention is to provide a process according to which thermoelectric modules of the kind as described above can be produced in high yield and at low processing cost.

A further object of the present invention is to provide a process for producing a thermoelectric module in which sintering for forming thermoelectric elements can be effected without pressure molding process.

A still further object of the present invention is to provide a process for producing a thermoelectric module in which sintering for forming thermoelectric elements can be effected in a non-oxidizing gas flow without sealing the thermoelectric elements or a module, being produced, in a container.

In the first aspect of the present invention, a thermoelectric module, comprises:

a first electrode array having a plurality of electrode pieces and a second electrode array having of a plurality of electrode pieces, the first and second electrode arrays being confronted with each other, the electrode pieces of the first electrode array being alternately connected with the electrode pieces of the second electrode array in such a way that one end portion of each electrode piece of the first electrode array is connected with one end portion of an electrode piece of the second electrode array through a thermoelectric element of first conductive type while the other end portion of the each electrode piece of the first electrode array is connected with one end portion of another electrode piece of the second electrode array through a thermoelectric element of second conductive type except that one end portion of any electrode piece and one end portion of another electrode piece are reserved for output terminals.

Here, the thermoelectric elements of first and second conductive types may be respectively made of chalcogenide alloys.

The thermoelectric elements of first and second conductive type may be respectively made of p-type and n-type bismuth-antimony-selenium-tellurium alloys.

The material of the electrode pieces may be a member selected from the group consisting of tungsten, molybdenum, nickel, composite materials of copper or aluminum coated or plated with tungsten, molybdenum or nickel, composite materials of copper of aluminum cladded with tungsten foil or molybdenum foil, and composite materials of tungsten, molybdenum or nickel coated or plated with antimony.

The thermoelectric elements of first and second conductive type may be respectively made of chalcogenide alloys containing 2 weight % or less of a lead oxide glass frit admixed therewith.

The chalcogenide alloys may be respectively bismuth-antimony-selenium-tellurium alloys.

The electrode pieces of the first electrode array may be alternately connected with the electrode pieces of the second electrode array through only the thermoelectric elements.

In the second aspect of the present invention, a process for producing a thermoelectric module, comprises the steps of:

disposing on a holder a plurality of electrode pieces to constitute a first electrode array, while separately disposing on another holder a plurality of electrode pieces to constitute a second electrode array;

forming a layer of a thermoelectric material of first conductive type on one end of the surface of each disposed electrode piece of the first electrode array, while separately forming a layer of a thermoelectric material of second conductive type, different from the first conductive type, on one end of the surface of each disposed electrode piece of the second electrode array;

positioning the first and second electrode arrays to alternately connect the electrode pieces of the first electrode array with the electrode pieces of the second electrode array in such a way that one end of each electrode piece of the first electrode array is connected with one end of an electrode piece of the second electrode array through the layer of the thermoelectric material of first conductive type while the other end of the each electrode piece of the first electrode array is connected with one end of another electrode piece of the second electrode array through the layer of the thermoelectric material of second conductive type; and heating the positioned first and second electrode arrays and thermoelectric material layers to sinter the thermoelectric material layers to thereby form the thermoelectric module.

Here, the layers of the thermoelectric materials of first and second conductive types may be formed without pressing.

The sintering may be effected in a non-oxidizing gas flow.

In the third aspect of the present invention, a process for producing a thermoelectric module, comprises the steps of:

disposing on a holder a plurality of electrode pieces to constitute a first electrode array, while separately disposing on another holder a plurality of electrode pieces to constitute a second electrode array;

forming a layer of a thermoelectric material of first conductive type on one end of the surface of each disposed electrode piece of one electrode array selected from the first and second electrode arrays, while forming a layer of a thermoelectric material of second conductive type, different from the first conductive type, on the other end;

positioning the first and second electrode arrays to alternately connect the electrode pieces of the first electrode array with the electrode pieces of the second electrode array in such a way that one end of each electrode piece of the first electrode array is connected with one end of an electrode piece of the second electrode array through the corresponding layer of the thermoelectric material of first conductive type while the other end of the each electrode piece of the first electrode array is connected with one end of another electrode piece of the second electrode array through the corresponding layer of the thermoelectric material of second conductive type; and heating the positioned first and second electrode arrays and thermoelectric material layers to sinter the thermoelectric material layers to thereby form the thermoelectric module.

Here, the layers of the thermoelectric materials of first and second conductive types may be formed without pressing.

The sintering may be effected in a non-oxidizing gas flow.

In the fourth aspect of the present invention, a process for producing a thermoelectric module, comprises the steps of:

forming on a holder a plurality of layers of a thermoelectric material of first conductive type each having a predetermined form and a plurality of layers of a thermoelectric material of second conductive type, different from the first conductive type, each having a predetermined form without pressing;

sintering the formed layers in a non-oxidizing gas flow to form thermoelectric elements of first and second conductive types;

disposing on a holder a plurality of electrode pieces to constitute a first electrode array, while separately disposing on another holder a plurality of electrode pieces to constitute a second electrode array;

forming solder layers on both end portions of the surface of each electrode piece of the first and second electrode arrays;

positioning the first and second electrode arrays and the thermoelectric elements of first and second conductive types to alternately connect the electrode pieces of the first electrode array with the electrode pieces of the second electrode array in such a way that one end portion of each electrode piece of the first electrode is connected with one end portion of an electrode piece of the second electrode array through the corresponding thermoelectric element of first conductive type while the other end portion of the each electrode piece of the first electrode array is connected with one end portion of another electrode piece of the second electrode array through the corresponding thermoelectric element of the conductive type; and heating the positioned first and second electrodes and thermoelectric elements with the solder layers therebetween to solder the electrode pieces to the thermoelectric elements.

The above and other objects, effects, features and advantages of the present invention will become more apparent from the following description of embodiments thereof taken in conjunction with the accompanying drawings.

BRIEF DESCRIPTION OF THE DRAWINGS

FIGS. 1A to 1C are diagrams showing the structure of an example of the thermoelectric module of the present invention, of which FIG. 1A is a top plan view, FIG. 1B a side view, and FIG. 1C a bottom plan view.

DETAILED DESCRIPTION OF PREFERRED EMBODIMENTS

The present invention will now be described in detail while referring to the accompanying drawings.

Figure 1A:
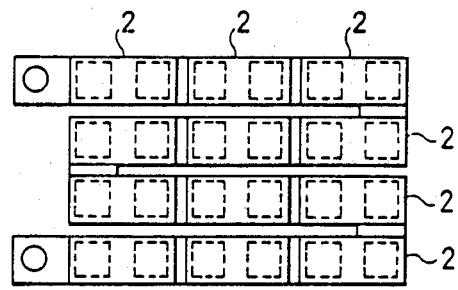
Figure 1B:
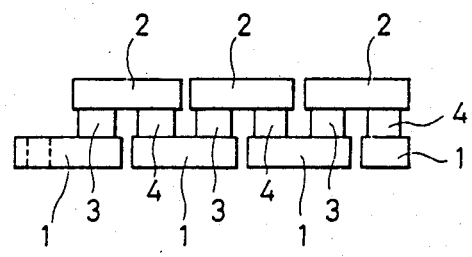
Figure 1C:
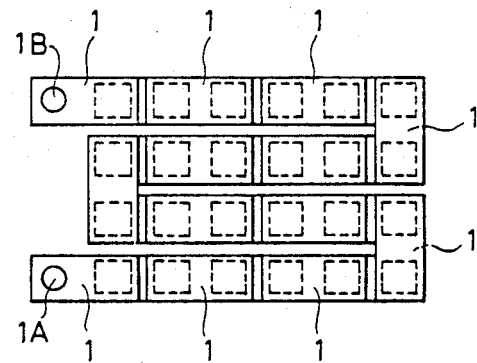

FIGS. 1A to 1C show an example of the thermoelectric module of the present invention. FIG. 1A is a top plane view, FIG. 1B a side view, and FIG. 1C a bottom plan view.

As shown in FIGS. 1A to 1C, the thermoelectric module of this example comprises an under electrode array consisting of 13 electrode pieces 1 and an upper electrode array consisting of 12 electrode pieces 2 for an example. Each electrode piece 1 of the under electrode array has one end portion connected with one end portion of an electrode piece 2 of the upper electrode array through a p-type thermoelectric element 3, and the other end portion connected with one end portion of another electrode piece 2 of the upper electrode array through an n-type thermoelectric element 4 except that the two leftmost electrode pieces 1 of the under electrode array each have a left end portion reserved for an output terminal. For instance, when the under and upper electrode arrays of the thermoelectric module having the above-mentioned structure is brought into contact with a low temperatures source ($T_c$) and a high temperature source ($T_h$), respectively, electric currents in $T_c \rightarrow T_h$ and $T_h \rightarrow T_c$ directions are induced across n-type thermoelectric elements 4 and p-type thermoelectric elements 3, respectively, to enable an electric power to be withdrawn from output terminals 1A and 1B.

Usable and preferable materials for thermoelectric elements include chalcogenide alloys, particularly preferably bismuth-antimony-selenium-tellurium alloys, doped with a dopant to be of p or n conductive type. More specifically, materials of $(Sb_2Te_3)_x(Bi_2Te_3)_y(Sb_2Se_3)_z$ alloy doped with 2 to 5 weight % of Te wherein $x=0.70$ to 0.72, $y=0.23$ to 0.27 and $z=0.03$ to 0.05 can be used as materials for p-type thermoelectric elements, while materials of $(Bi_2Te_3)_u(Sb_2Te_3)_v(Sb_2Se_3)_w$ alloy doped with 1.5 to $2.0 \times 10^{19}$ mol/cm$^3$ wherein $u=0.90$ to 0.98, $v=0$ to 0.5 and $w=0.02$ to 0.05 can be used as materials for n-type thermoelectric elements.

Further, $HgBr_2$ and $SbCl_3$ can be used as n-type dopants, while Se can be used as a p-type dopant. Besides, all other dopants capable of being used for the above-mentioned quasi-ternary alloys may be used. Furthermore, use may be made of quasi-binary alloys, such as a $(Sb_2Te_3)_{75}(Bi_2Te_3)_{25}$ alloy doped with Se or Te for p-type thermoelectric elements and a $(Bi_2Te_3)_{75}(Bi_2Se_3)_{25}$ alloy doped with $HgBr_2$ or $SbCl_3$ for n-type thermoelectric elements.

As materials for electrodes, use can be made of metallic materials such as nickel, tungsten, and molybdenum and electroconductive composite materials such as copper and aluminum coated or plated with molybdenum, tungsten, nickel or the like, copper and aluminum cladded with a tungsten foil or a molybdenum foil, and composite materials of tungsten, molybdenum or nickel coated or plated with antimony.

An example of the process for producing a thermoelectric module according to the present invention will now be described while referring to FIGS. 2A to 2F.

An ingot of a material for p-type thermoelectric elements, prepared by doping an alloy having a composition of $(Sb_2Te_3)_{0.72}(Bi_2Te_3)_{0.25}-(Sb_2Se_3)_{0.03}$ with 3.5 weight % of Te, was pulverized with a ball mill or the like and mixed with a solvent such as propylene glycol to prepare a p-type paste. Similarly, an ingot of a material for n-type thermoelectric elements, prepared by doping an alloy having a composition of $(Bi_2Te_3)_{0.9}(Sb_2Te_3)_{0.05}(Sb_2Se_3)_{0.05}$ with $0.7 \times 10^{19}$ mol/cm$^3$ of $SbI_3$, was pulverized with a ball mill or the like and mixed with a solvent such as propylene glycol to prepare an n-type paste.

Figure 2A:
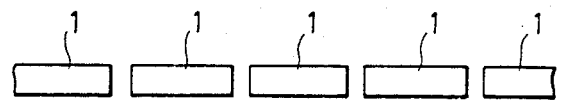
FIGS. 2A to 2F, FIGS. 3A to 3D, and FIGS. 4A to 4F are process diagrams illustrative of respective examples of the process for producing a thermoelectric module according to the present invention.

As shown in FIG. 2A, a plurality of electrode pieces 1 of copper coated with tungsten were disposed on respective predetermined areas of the plane of a holder. Additionally stated, in FIGS. 2A to 2F, only one row of electrode pieces are shown only for convenience of illustration, but a predetermined number of electrode pieces for one or more modules were actually disposed in a plurality of rows on the plane of the holder.

Figure 2B:
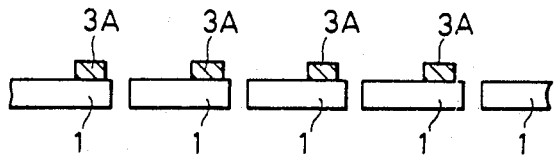

Subsequently, as shown in FIG. 2B, the abovementioned p-type paste was applied on one end portion of each electrode piece 1 by printing or the like technique, and dried at 50° C. to form a p-type thermoelectric material layer 3A having predetermined form and thickness.

Figure 2C:
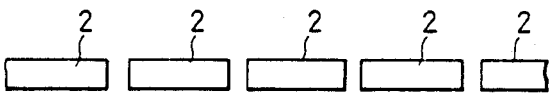
Figure 2D:
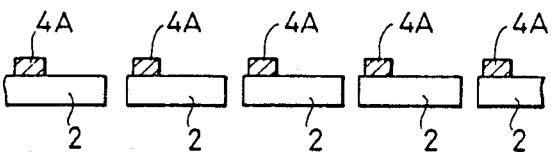

As shown in FIGS. 2C and 2D, a plurality of electrode pieces 2 made of the same material as used for the electrode pieces 1 were disposed in substantially the same manner as in the case of the electrode pieces 1, and the above-mentioned n-type paste was applied on one end portion of each electrode piece 2 and dried in substantially the same manner as in the case of the p-type paste to form an n-type thermoelectric material layer 4A.

Figure 2E:
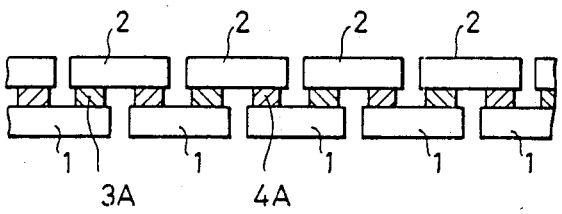

Subsequently, as shown in FIG. 2E, the electrode pieces with the respective thermoelectric material layers formed on the respective one end portions thereof, while still fixed on the respective holders, were positioned and fixed with a fixing tool in such a way that the electrode pieces 1 were confronted with the electrode pieces 2 with the thermoelectric material layers 3A and 4A sandwiched therebetween while the p-type thermoelectric material layers and the n-type thermoelectric layers were positioned on one end portions and the other end portions, respectively, of the electrode pieces.

Figure 2F:
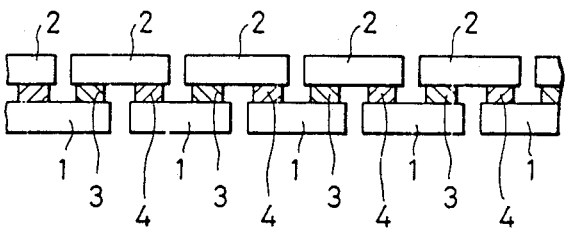

Thereafter, as shown in FIG. 2F, the thermoelectric material layers 3A and 4A on the respective end portions of the electrode pieces were preheated in a flow of non-oxidizing such as argon at about 175° C. for at least 3 hours, and then sintered in the same gas flow at a temperature of 460° to 480° C. to form p-type and n-type thermoelectric elements 3 and 4, respectively, while at the same time the thermoelectric elements 3 and 4 were bonded to the electrode pieces 1 and 2 through a solid phase diffusion reaction. Thus, one or more thermoelectric modules were produced.

When a thermoelectric module to be produced according to the procedure as described just above was to be used as a thermoelectric power generation module which uses a difference in oceanic temperature as a heat source, for example, a module composed of thermoelectric elements each having an area of 3 mm × 9 mm and a thickness of 0.3 mm and copper electrode pieces coated with tungsten and each having an area of 11 mm × 11 mm and a thickness of 1 mm could be obtained. Those thermoelectric elements each had a volume as small as less than one twentieth of that of a conventional thermoelectric element (13 mm in diameter × 1.5 mm in thickness) and a weight per unit output as light as less than one tenth of that of the conventional thermoelectric element.

Figure 3A:
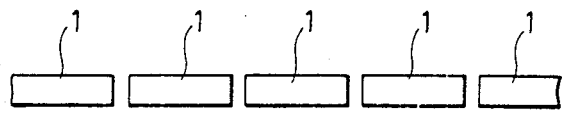
Figure 3B:
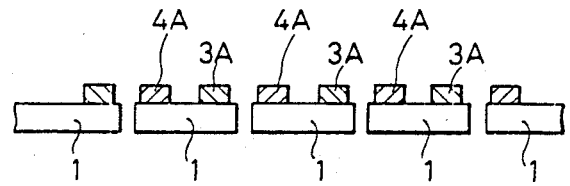
Figure 3C:
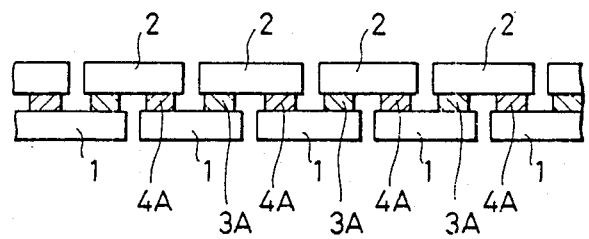
Figure 3D:
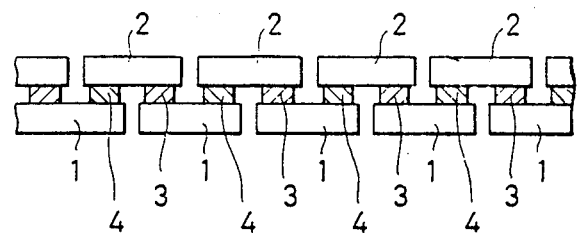

FIGS. 3A to 3D illustrate another example of the process for producing a thermoelectric module according to the present invention. First, pastes of p-type and n-type thermoelectric materials having the respective abovementioned compositions were prepared. As shown in FIG. 3A, a predetermined number of electrode pieces 1 for one or more modules were disposed on a holder. Subsequently, as shown in FIG. 3B, the p-type paste and the n-type paste were applied on one end portions and the other end portions, respectively, of the electrode pieces 1 and dried to form p-type thermoelectric material layers 3A and n-type thermoelectric material 4A, respectively. Thereafter, as shown in FIG. 3C, electrode pieces 2 were positioned on the thermoelectric material layers 3A and 4A, which were then dried and sintered in the same manner as in the preceding example to form p-type and n-type thermoelectric elements 3 and 4, respectively. Thus, a thermoelectric module(s) as shown in FIG. 3D was produced.

According to the procedures as respectively illustrated in FIGS. 2A to 2F and FIGS. 3A to 3D, since the production of a thermoelectric module does not required the steps of cutting a thermoelectric material and utilizes a solid phase diffusion reaction which proceeds simultaneously with the sintering of thermoelectric material layers to bond the resulting thermoelectric elements to electrode pieces without the step of bonding the former to the latter through soldering or the like technique, remarkable improvements in the yield and reliability, which have heretofore been impossible, can be realized.

Further, according to the above-mentioned procedures, since thermoelectric element layers can be sintered without pressure molding process and in a nonoxidizing gas flow without sealing a thermoelectric module, being produced, in an ampule, the productivity can be improved.

Figure 4A:
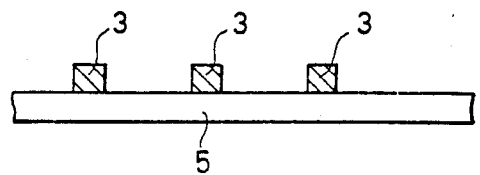
Figure 4B:
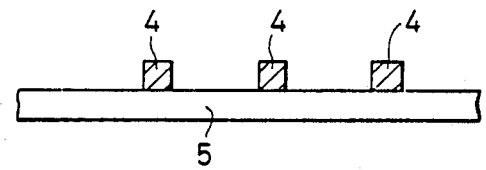
Figure 4C:
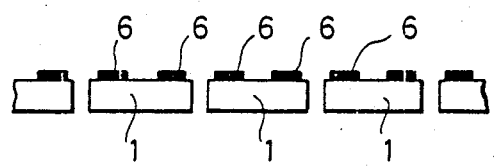
Figure 4D:
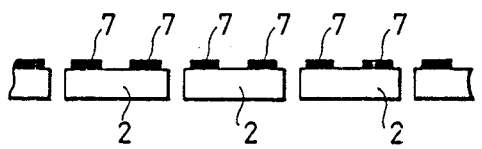
Figure 4E:
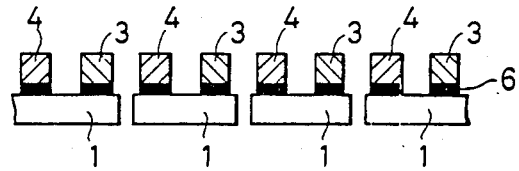
Figure 4F:
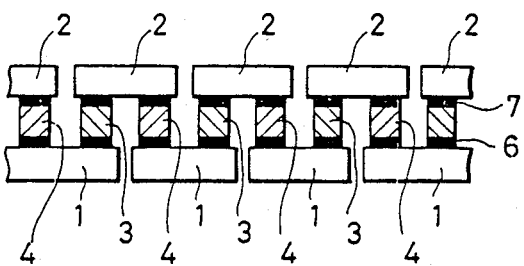

FIGS. 4A to 4F illustrate still another example of the process for producing a thermoelectric module according to the present invention. Pastes of p-type and n-type thermoelectric materials having the same respective compositions as in the foregoing examples were prepared. As shown in FIG. 4A, the p-type paste was applied on predetermined areas of the plane of a holder 5 such a quartz glass plate through printing or the like technique and dried at 50° C. to form p-type thermoelectric material layers having predetermined form and thickness simultaneously for one or more modules. Subsequently, the paste layers on the holder 5 were dried in a flow of argon at about 175° C. for at least 3 hours and then sintered in the same atmosphere at a temperature of 460° to 480° C. to form p-type thermoelectric elements 3 simultaneously for the one or more modules on the predetermined areas of the plane of the holder 5. As shown in FIG. 4B, a plurality of n-type thermoelectric elements 4 having predetermined form and thickness were formed on predetermined areas of the plane of a holder in substantially the same manner as in the formation of the p-type thermoelectric elements 3. Subsequently, as shown in FIG. 4C, under copper electrode pieces 1 were disposed on the predetermined areas of the plane of a holder, and a paste of a bismuth-tin eutectric solder was applied on both end portions of each electrode pieces 1 through printing or the like technique and dried to form solder layers 6. As shown in FIG. 4D, solder layers 7 were formed on upper copper electrode pieces 2 in substantially the same manner as described just above. Subsequently, as shown in FIG. 4E, the p-type and n-type thermoelectric elements 3 and 4, while still held on the respective predetermined areas, were positioned on the solder layers 6 formed on the under copper electrode pieces 1. Thereafter, as shown in FIG. 4F, the upper copper electrode pieces 2 with the solder layers 7 formed thereon were positioned on the thermoelectric elements 3 and 4, followed by heating to effect soldering. Thus, a thermoelectric module(s) was produced.

According to the procedure as illustrated in FIGS. 4A to 4F, thermoelectric material layers are sintered without pressure molding process and in a non-oxidizing gas flow without sealing a thermoelectric module, being produced, in an ampule, just like the examples as illustrated in FIGS. 2A to 2F and FIGS. 3A to 3D.

Where a thermoelectric module to be produced according to the procedure as described just above was to be use as a thermoelectric power generation module which uses a difference in oceanic temperature as a heat source, for example, a module composed of thermoelectric elements each having an area of 3 mm × 9 mm and a thickness of 0.3 mm and copper electrode pieces coated with tungsten and each having an area of 11 mm × 11 mm and a thickness of 1 mm could be obtained. Those thermoelectric elements each had a volume as small as less than one twentieth of a conventional thermoelectric element (13 mm in diameter × 1.5 mm in thickness) and a weight per unit output as light as less than one tenth of that of the conventional thermoelectric element, just like the aforementioned example.

Now a process for increasing the reliability of the thermoelectric modules produced according to the present invention, in which the sintering is effected without pressure molding, will be explained. In this process, for increasing the mechanical strength of the thermoelectric elements a lead oxide glass frit is incorporated into materials of thermoelectric elements. That is, a lead glass frit is added to a bismuth-antimony-selenium-tellurium alloy doped with a dopant to form a p-type or n-type thermoelectric material as mentioned above. Specifically, as a p-type thermoelectric material, use may be made of a material of $(Sb_2Te_3)_x(Bi_2Te_3)_y(Sb_2Se_3)_z$ alloy admixed with a lead glass frit and doped with 2 to 5 weight % of Te wherein $x=0.70$ to $0.72$, $y=0.23$ to $0.27$ and $z=0.03$ to $0.05$, while as an n-type thermoelectric material, use may be made of a material of $(Bi_2Te_3)_u(Sb_2Te_3)_v(Sb_2Se_3)_w$ alloy admixed with a lead glass frit and doped with 1.5 to 2.0 × $10^{19}$ mol/cm$^3$ of $SbI_3$ wherein $u=0.90$ to $0.98$, $v=0$ to $0.5$ and $w=0.02$ to $0.05$.

An ingot of an alloy having a composition of $(Sb_2Te_3)_{0.72}(Bi_2Te_3)_{0.25}(Sb_2Se_3)_{0.03}$, admixed with 0.5 weight % of a lead glass frit and doped with 3.5 weight % of Te, as a p-type thermoelectric material was pulverized with a ball mill or the like and mixed with a solvent such as propylene glycol to prepare a p-type paste. An ingot of an alloy having a composition of $(Bi_2Te_3)_{0.9}(Sb_2Te_3)_{0.05}(Sb_2Se_3)_{0.05}$, admixed with 0.5 weight % of a lead glass frit and doped with $1.7 \times 10^{19}$ mol/cm$^3$ of $SbI_3$, as an n-type thermoelectric material was pulverized with a ball mill or the like and mixed with a solvent such as propylene glycol to prepare an n-type paste. A thermoelectric module was produced using the p-type and n-type pastes thus prepared according to the procedure as illustrated in FIGS. 2A to 2F.

Where a thermoelectric module to be produced using the above-mentioned thermoelectric materials containing the lead glass frit according to the procedure as illustrated in FIGS. 2A to 2F was to be used as an thermoelectric power generation module which uses a difference in oceanic temperature as a heat source, for example, a module composed of thermoelectric elements each having an area of 3 mm × 9 mm and a thickness of 0.3 mm and copper electrode pieces coated with tungsten and each having an area of 11 mm × 11 mm and a thickness of 1 mm could be obtained. Those thermoelectric elements each had a volume as small as less than one twentieth of that of a conventional thermoelectric element (13 mm in diameter × 1.5 mm in thickness) and a weight per unit output as light as less than one tenth of that of the conventional thermoelectric element.

Thermoelectric modules were produced using the above-mentioned thermoelectric materials containing the lead glass frit according to the respective procedures as illustrated in FIGS. 3A to 3D and FIGS. 4A to 4F.

The dimensions and output of the module produced according to the procedure as illustrated in FIGS. 3A to 3D were the same as those of the module produced according to the procedure as illustrated in FIGS. 2A to 2F. Where a thermoelectric module to be produced using the above-mentioned thermoelectric materials containing the lead glass frit according to the procedure as illustrated in FIGS. 4A to 4F was to be used as an electric power generation module which uses a difference in oceanic temperature as a heated source, for example, a module composed of thermoelectric elements each having an area of 3 mm $\times$ 9 mm and a thickness of 0.3 mm and copper electrode pieces coated with tungsten and each having an area of 11 mm $\times$ 11 mm and a thickness of 1 mm could be obtained. Those thermoelectric elements each had a volume as small as lles than one twentieth of that of a conventional thermoelectric element (13 mm in diameter $\times$ 1.5 mm in thickness) and a weight per unit output as light as less than one tenth of that of the conventional thermoelectric element.

When a lead glass frit is incorporated into thermoelectric elements, the mechanical strength of the elements is improved as described above to facilitate the higher reliability, thinning of thermoelectric modules and the automation of production thereof.

Materials that can be used for forming thermoelectric elements in the present invention include not only chalcogenide alloys such as bismuth-antimony-selenium-tellurium alloys as mentioned above, zinc-antimony alloys, and lead-tellurium alloys, but also all materials having a high thermoelectric figure of merit and capable of being sintered, from among which a suitable material may be chosen according to the use of a thermoelectric module to be produced and the temperature range within which the thermoelectric module is to be used.

As the amount of a lead oxide glass frit incorporated into thermoelectric elements is increased, the mechanical strength of the thermoelectric elements rises. When the above-mentioned amounts exceeds 2 weight %, however, the electric conductivity of the thermoelectric elements notably drops to lower the thermoelectric conversion characteristic thereof. As to above-mentioned bismuth-antimony-selenium-tellurium alloys the optimum amount of the lead oxide glass frit is about 0.5 weight %, although the range of the amount of the lead oxide frit within which is serves effectively is from 0.1 to 2 weight %.

Any solvent can be used to form a paste of a thermoelectric material in so far as it can provide a suitable viscosity of the paste and be completely removed in the drying and preheating steps. As an electroconductive electrode material, use can be made of any material which can realize bonding thereof to a thermoelectric material with good electrical and mechanical characteristics of the bonding through a solid phase diffusion reaction in the sintering step and keep the diffusion from progressing excessively in the sintering step and/or during the use of a thermoelectric module not to deteriorate the thermoelectric conversion characteristics of the thermoelectric module. Examples of such an electrode material include the aforementioned metallic materials and electroconductive composite materials. In the procedures as respectively illustrated in FIGS. 2A to 2F and FIGS. 3A to 3D, however, copper, iron and copper plated with 30 $\mu$m-thick nickel are unsuitable as electroconductive electrode materials for use in combination with thermoelectric elements made of bismuth-antimony-selenium-tellurium alloy materials because they deteriorate the thermoelectric conversion characteristics in the sintering step. As the method of forming layers of p-type and n-type thermoelectric materials on electrode pieces, use can be made of not only the printing method but also the plasma spray method and a method in which a paste of a thermoelectric material with the viscosity thereof adjusted low is ejected from a nozzle to form layers having a predetermined form. In the latter two methods, neither a screen nor a mask is necessary. According to an one of these methods, layers of thermoelectric materials can be formed on electrode pieces without pressure molding. Without sealing a module, being produced, in an ampule, preheating and sintering can be affected in a flow of an inert or reducing atmosphere of argon-diluted hydrogen, nitrogen or the like which prevents thermoelectric elements, being formed, from being oxidized in the sintering step.

As described above, since the thermoelectric module of the present invention may have a thin structure, the weight thereof per unit output can be very light as compared with conventional thermoelectric modules. When a lead glass frit is incorporated into the thermoelectric elements of the thermoelectric module of the present invention, the mechanical strength of the elements and the reliability of the module can be improved and the automation of production of thermoelectric modules can be faciliated and hence realize a decrease in the processing cost, which has heretofore been impossible.

According to the process of the present invention, since thermoelectric elements are produced by forming and sintering thin layers of materials to constitute thermoelectric elements, thermoelectric elements of even 0.3 mm or less in thickness can be produced to realize miniaturization of thermoelectric modules and hence a decrease in the material cost, both of which have heretofore been impossible. Further, since every step of the process is operable simultaneously for one or more modules to enable even several thermoelectric modules to be produced through a single run of the process and the process comprises formation, without pressure molding process, and sintering, without sealing, of layers of thermoelectric materials to produce thermoelectric elements, the production of thermoelectric modules can be easily automated to realize a decrease in the processing cost, which has heretofore been impossible.

Furthermore, the process of the present invention can prevent a decrease in the yield and the formation of defective modules as have heretofore occurred in the steps of cutting and soldering a thermoelectric material, whereby a decrease in the processing cost and an improvement in the reliability can be realized.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A process for producing a thermoelectric module, comprising the steps of:
   disposing on a holder a plurality of electrode pieces to constitute a first electrode array, while separately disposing on another holder a plurality of electrode pieces to constitute a second electrode array;
   forming a layer of a thermoelectric material of first conductive type on one end of the surface of each disposed electrode piece of said first electrode array, while separately forming a layer of a thermoelectric material of second conductive type, different from said first conductive type, on one end of the surface of each disposed electrode piece of said second electrode array;
   positioning said first and second electrode arrays to alternately connect said electrode pieces of said first electrode array with said electrode pieces of said second electrode array in such a way that one end of each electrode piece of said first electrode array is connected with one end of an electrode piece of said second electrode array through the layer of said thermoelectric material of first conductive type while the other end of said each electrode piece of said first electrode array is connected with one end of another electrode piece of said second electrode array through the layer of said thermoelectric material of second conductive type; and
   heating said positioned first and second electrode arrays and thermoelectric material layers to sinter said thermoelectric material layers to thereby form said thermoelectric module.

2. A process for producing a thermoelectric module as claimed in claim 1, wherein said layers of said thermoelectric materials of first and second conductive types are formed without pressing.

3. A process for producing a thermoelectric module as claimed in claim 1, wherein said sintering is effected in a non-oxidizing gas flow.

4. A process for producing a thermoelectric module, comprising the steps of:
   disposing on a holder a plurality of electrode pieces to constitute a first electrode array, while separately disposing on another holder a plurality of electrode pieces to constitute a second electrode array;
   forming a layer of a thermoelectric material of first conductive type on one end of the surface of each disposed electrode piece of one electrode array selected from said first and second electrode arrays, while forming a layer of a thermoelectric material of second conductive type, different from said first conductive type, on the other end;
   positioning said first and second electrode arrays to alternately connect said electrode pieces of said first electrode array with said electrode pieces of said second electrode array in such a way that one end of each electrode piece of said first electrode array is connected with one end of an electrode piece of said second electrode array through the corresponding layer of said thermoelectric material of first conductive type while the other end of said each electrode piece of said first electrode array is connected with one end of another electrode piece of said second electrode array through the corresponding layer of said thermoelectric material of second conductive type; and
   heating said positioned first and second electrode arrays and thermoelectric material layers to sinter said thermoelectric material layers to thereby form said thermoelectric module.

5. A process for producing a thermoelectric module as claimed in claim 4, wherein said layers of said thermoelectric materials of first and second conductive types are formed without pressing.

6. A process for producing a thermoelectric module as claimed in claim 4, wherein said sintering is effected in a non-oxidizing gas flow.

7. A process for producing a thermoelectric module, comprising the steps of:
   forming on a holder a plurality of layers of a thermoelectric material of first conductive type each having a predetermined form and a plurality of layers of a thermoelectric material of second conductive type, different from said first conductive type, each having a predetermined form without pressing;
   sintering said formed layers in a non-oxidizing gas flow to form thermoelectric elements of first and second conductive types;
   disposing on a holder a plurality of electrode pieces to constitute a first electrode array, while separately disposing on another holder a plurality of electrode pieces to constitute a second electrode array;
   forming solder layers on both end portions of the surface of each electrode piece of said first and second electrode arrays;
   positioning said first and second electrode arrays and said thermoelectric elements of first and second conductive types to alternately connect said electrode pieces of said first electrode array with said electrode pieces of said second electrode array in such a way that one end portion of each electrode piece of said first electrode is connected with one end portion of an electrode piece of said second electrode array through the corresponding thermoelectric element of first conductive type while the other end portion of said each electrode piece of said first electrode array is connected with one end portion of another electrode piece of said second electrode array through the corresponding thermoelectric element of said conductive type; and
   heating said positioned first and second electrodes and thermoelectric elements with said solder layers therebetween to solder said electrode pieces to said thermoelectric elements.

* * * * *